US010222045B2

(12) United States Patent
Li

(10) Patent No.: US 10,222,045 B2
(45) Date of Patent: Mar. 5, 2019

(54) LED LAMP WITH LIQUID SEALANT

(71) Applicant: Feng Li, Guangdong (CN)

(72) Inventor: Feng Li, Guangdong (CN)

( * ) Notice: Subject to any disclaimer, the term of this patent is extended or adjusted under 35 U.S.C. 154(b) by 0 days.

(21) Appl. No.: 15/310,792

(22) PCT Filed: Oct. 15, 2015

(86) PCT No.: PCT/CN2015/091992
§ 371 (c)(1),
(2) Date: Nov. 14, 2016

(87) PCT Pub. No.: WO2017/049680
PCT Pub. Date: Mar. 30, 2017

(65) Prior Publication Data
US 2018/0209631 A1    Jul. 26, 2018

(30) Foreign Application Priority Data

Sep. 24, 2015   (CN) .......................... 2015 1 0618505

(51) Int. Cl.
| | |
|---|---|
| F21V 29/56 | (2015.01) |
| F21S 2/00 | (2016.01) |
| H01L 33/64 | (2010.01) |
| F21K 9/64 | (2016.01) |
| F21V 3/12 | (2018.01) |
| F21V 5/00 | (2018.01) |
| F21V 19/00 | (2006.01) |
| F21Y 115/10 | (2016.01) |

(52) U.S. Cl.
CPC ................ F21V 29/56 (2015.01); F21K 9/64 (2016.08); F21S 2/00 (2013.01); F21V 3/12 (2018.02); F21V 5/00 (2013.01); F21V 19/0015 (2013.01); H01L 33/64 (2013.01); F21Y 2115/10 (2016.08)

(58) Field of Classification Search
CPC ... F21V 29/56; F21V 3/12; F21V 5/00; F21V 19/0015; F21K 9/64; F21K 9/62
USPC .............. 362/84, 236–241, 249.02, 298–302
See application file for complete search history.

(56) References Cited

U.S. PATENT DOCUMENTS

| | | | | |
|---|---|---|---|---|
| 7,654,687 B2 * | 2/2010 | Tsai | ...................... | G02B 5/0247 257/98 |
| 8,322,884 B2 * | 12/2012 | Ramer | .................... | H01L 33/44 362/242 |
| 2010/0149783 A1 * | 6/2010 | Takenaka | .................. | F21K 9/00 362/84 |

* cited by examiner

Primary Examiner — Laura Tso

(57) ABSTRACT

An LED lamp includes a transparent sheet, a grid casing, a printed circuit board (PCB), liquid sealant, and a lid. The transparent sheet covers on a top of the grid casing. The PCB is located between the grid casing and the lid. The grid casing has a surrounding portion and a grille portion. The lid covers a bottom of the grille portion and secures the PCB. A sealed room is formed in the grille portion and enclosed by the transparent sheet, the grid casing and the lid. The surrounding portion has a feeding channel communicating with the grille portion. The liquid sealant is fed into the sealed room through the feeding channel. The feeding channel is finally closed to seal the liquid sealant.

10 Claims, 2 Drawing Sheets

LED LAMP WITH LIQUID SEALANT

FIELD OF THE INVENTION

The present invention relates to an LED lamp, and more particularly to the LED lamp which is filled with liquid sealant.

BACKGROUND OF THE INVENTION

Conventional LED lamps are hard to dissipate heat from multiple high-power LED chips, so the multiple high-power LED chips are easy to be broken down after having used for a long time.

So how to package the LED lamp to be accompanied with enough heat dissipation ability is an unavoidable issue.

SUMMARY OF THE INVENTION

A primary objective of the present invention is to provide an LED lamp with liquid sealant, which dissipates heat quickly by using the liquid sealant and is simplified.

To accomplish the above objective, the LED lamp with liquid sealant provided by the present invention includes a transparent sheet, a grid casing, a printed circuit board (PCB), liquid sealant, and a lid. The transparent sheet covers on a top of the grid casing. The PCB is located between the grid casing and the lid. The grid casing has a surrounding portion and a grille portion. The lid covers a bottom of the grille portion and secures the PCB. A sealed room is formed in the grille portion and enclosed by the transparent sheet, the grid casing and the lid. The surrounding portion has a feeding channel communicating with the grille portion. The liquid sealant is fed into the sealed room through the feeding channel. The feeding channel is finally closed to seal the liquid sealant.

DETAILED DESCRIPTION OF THE PREFERRED EMBODIMENTS

Figure 1:
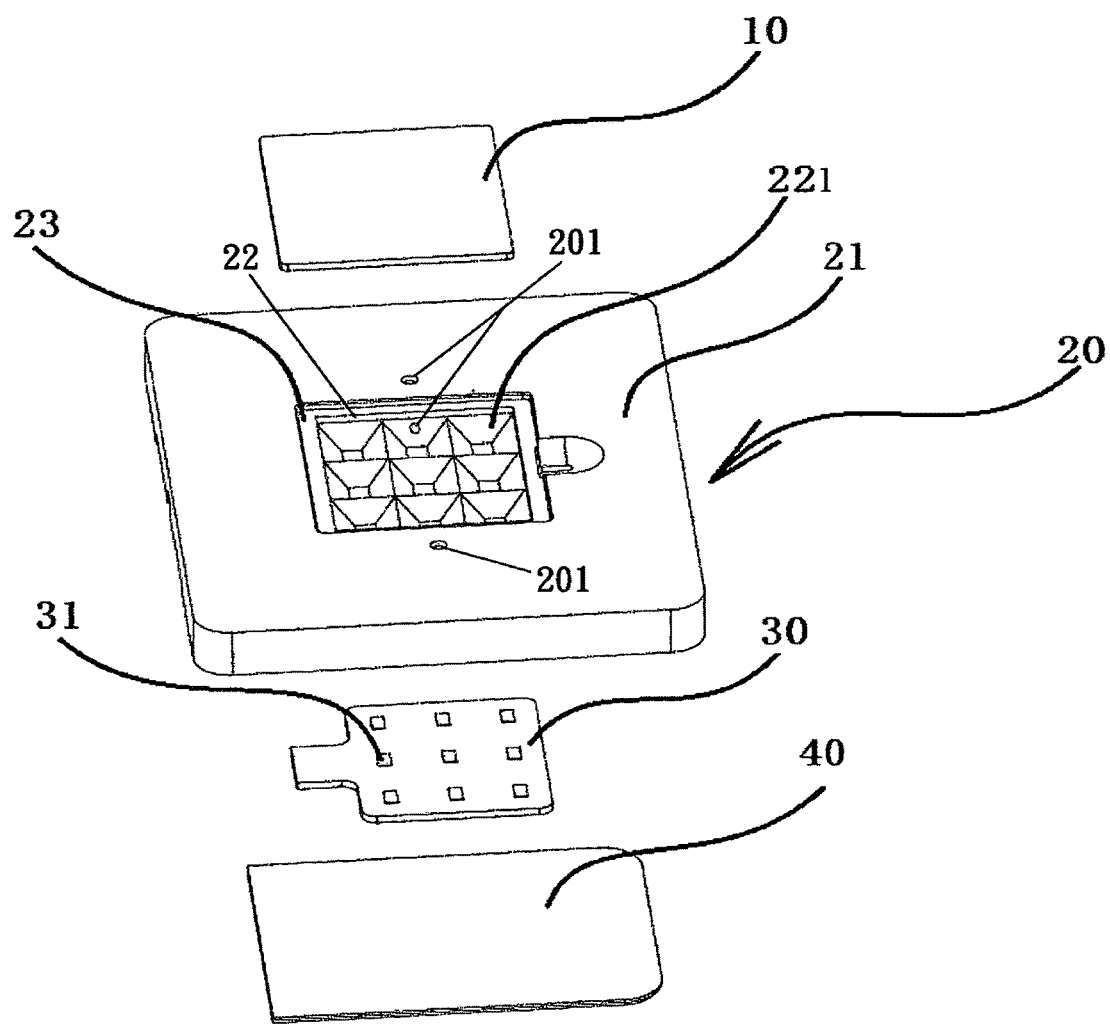
FIG. 1 is an exploded view of the present invention.
Figure 2:
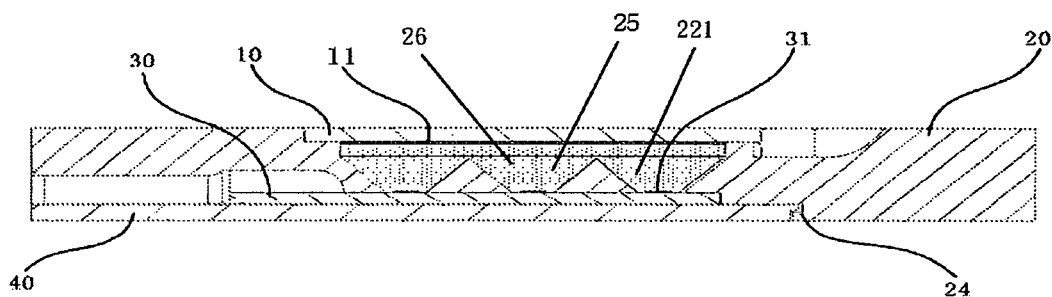
FIG. 2 is a cross sectional view showing the assembly of the present invention.

With reference to FIGS. 1 and 2, an LED lamp with liquid sealant according to a preferred embodiment of the present invention comprises: a transparent sheet 10, a grid casing 20, a printed circuit board (PCB) 30, and a lid 40. The transparent sheet 10 covers on a top of the grid casing 20. The lid 40 covers a bottom of the grid casing 20 and fixes the PCB 30. As a result, the PCB 30 is sandwiched between the grid casing 20 and the lid 40.

The grid casing 20 includes a surrounding portion 21 and a grille portion 22 surrounded by the surrounding portion 21. The grille portion 22 has multiple refraction rooms 221, and each of the multiple refraction rooms 221 is in a conic shape.

The surrounding portion 21 of the grid casing 20 is formed with one or more feeding channels 201 communicating with the grille portion 22, so that liquid sealant 25 can be fed into the grille portion 22 though the feeding channels 201. The feeding channels 201 will be closed after feeding the liquid sealant 25 is finished to seal the liquid sealant 25.

The top of the grille portion 22 is covered by the transparent sheet 10, and the bottom of the grille portion 22 is covered by the lid 40. As a result, a sealed room 26 is formed in the grille portion 22 and enclosed by the transparent sheet 10, grid casing 20 and the lid 40. The liquid sealant 25 is filled in the sealed room 26.

Each refraction room 221 of the grille portion 22 has a hollow area and four peripheral walls surrounding the hollow area.

The PCB 30 is accommodated inside the grid casing 20 and under the grille portion 22. There are multiple LED chips 31 mounted on the PCB 30. Each LED chip 31 corresponds to one of the refraction rooms 221 of the grille portion 22. In detail, each of multiple LED chips 31 is housed in one of the refraction rooms 221.

The grid casing 20 further includes a fixing shoulder 23 surrounding the top of the grille portion 22. A size of the fixing shoulder 23 is equal to that of the transparent sheet 10 so that the fixing shoulder 23 can secure the transparent sheet 10.

The PCB 30 is a ceramic PCB or an aluminum PCB.

The grid casing 20 further includes the accommodation chamber 24 located in the bottom thereof. The lid 40 is received in the accommodation chamber 24 of the grid casing 20 so as to secure the PCB 30.

The accommodation chamber 24 is a rectangular recess corresponding to the grille portion 22 of the grid casing 20 in position, such that the lid 40 can be secured in the accommodation chamber 24 of the grid casing 20.

The transparent sheet 10 includes a fluorescent film 11 facing to the grille portion 22 of the grid casing 20. The fluorescent film 11 is made of any one of sapphire, acrylic, and glass.

Said each LED chip 31 emits lights in said each refraction room 221 of the grille portion 22 so as to enhance luminous efficiency by way of each refraction room 221. Preferably, said each refraction room 221 of the grille portion 22 accommodates the liquid sealant 25 so that when the liquid sealant 25 is fed into the grille portion 22 of the grid casing 20, the liquid sealant 25 contacts with said each LED chip 31 and the fluorescent film 11, hence the lights transmits to exterior environment via the liquid sealant 25 and the fluorescent film 11.

The liquid sealant 25 is any one of heat conduction oil, silicone oil, ultrapure water, distilled water, and deionized water.

In assembling, the PCB 30 is embedded in the grid casing 20, the lid 40 covers the bottom of the grid casing 20 and fixes the PCB 30, and the transparent sheet 10 with the fluorescent film 11 is fixed in the grille portion 22 on the fixing shoulder 23. Thereafter, the liquid sealant 25 is fed into the sealed room 26 through the feeding channels 201, and the feeding channels are finally closed to seal the liquid sealant 25 in the sealed room 26.

Thereby, the LED lamp of the present invention dissipates heat quickly by the liquid sealant 25 and its structure is simplified.

Furthermore, the liquid sealant 25 received in the refraction rooms 221 of the grille portion 22 is in contact with the LED chips 31 and the fluorescent film 11, hence the lights from the LED chips 31 can pass through the liquid sealant 25 and the fluorescent film 11 and the liquid sealant 25 can transfer heat from the LED chips 31 to the grid casing 20.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. An LED lamp comprising:
   a transparent sheet;
   a grid casing, having a surrounding portion and a grille portion surrounded by the surrounding portion, and the grille portion having a top covered by the transparent sheet;
   a printed circuit board (PCB), embedded in the grid casing;
   a lid, covering a bottom of the grid casing and fixing the PCB, wherein a sealed room is formed in the grille portion and enclosed by the transparent sheet, the grid casing and the lid; and
   a liquid sealant received in the sealed room;
   wherein the PCB is sandwiched between the grid casing and the lid, the surrounding portion of the grid casing includes feeding channel communicating with the sealed room, the liquid sealant is fed into the sealed room through the feeding channel, and the feeding channel is closed to seal the liquid sealant.

2. The LED lamp as claimed in claim 1, wherein the grille portion has multiple refraction rooms, and each of the multiple refraction rooms is in conic shape.

3. The LED lamp as claimed in claim 1, wherein the grid casing further includes a fixing shoulder surrounding the top of the grille portion, and a size of the fixing shoulder is equal to that of the transparent sheet so that the fixing shoulder fixes the transparent sheet.

4. The LED lamp as claimed in claim 2, wherein the PCB is located under the grille portion and includes multiple LED chips mounted thereon, and each of the multiple LED chips corresponds to one of the refraction rooms of the grille portion.

5. The LED lamp as claimed in claim 1, wherein the PCB is a ceramic PCB or an aluminum PCB.

6. The LED lamp as claimed in claim 1, wherein the grid casing further comprises an accommodation chamber defined in the bottom thereof, and the lid is secured in the accommodation chamber of the grid casing so as to fix the PCB.

7. The LED lamp as claimed in claim 6, wherein the accommodation chamber is a rectangular recess of the grid casing.

8. The LED lamp as claimed in claim 2, wherein the transparent sheet includes a fluorescent film facing to the multiple refraction rooms.

9. The LED lamp as claimed in claim 1, wherein the liquid sealant has heat conductivity, low volatility, and high burning point.

10. The LED lamp as claimed in claim 9, wherein the liquid sealant is any one of heat conduction oil, silicone oil, ultrapure water, distilled water, and deionized water.

* * * * *